United States Patent [19]

Adams et al.

[11] Patent Number: 4,641,043

[45] Date of Patent: Feb. 3, 1987

[54] PRINTED WIRING BOARD MEANS WITH ISOLATED VOLTAGE SOURCE MEANS

[75] Inventors: John T. Adams; John E. Bohan, Jr., both of Minneapolis, Minn.

[73] Assignee: Honeywell Inc., Minneapolis, Minn.

[21] Appl. No.: 775,287

[22] Filed: Sep. 12, 1985

[51] Int. Cl.$^4$ .................. H01H 37/00; F23N 23/00
[52] U.S. Cl. .................. 307/117; 307/116; 307/141; 431/24; 431/25; 431/26; 361/404
[58] Field of Search ............ 307/116, 117, 141; 431/18, 19, 20, 21, 22, 23, 24, 25, 26, 29, 69, 6, 28, 67; 328/4, 6; 361/397

[56] References Cited

U.S. PATENT DOCUMENTS

| | | | |
|---|---|---|---|
| 3,574,496 | 4/1971 | Hewitt | 431/25 X |
| 3,671,815 | 6/1972 | Eberle et al. | 328/6 X |
| 3,702,025 | 11/1972 | Archer | 29/574 |
| 3,840,322 | 10/1974 | Cade | 307/117 X |
| 3,852,644 | 12/1974 | Seidler et al. | 317/101 |
| 3,909,680 | 9/1975 | Tsunashima | 317/101 |
| 4,000,961 | 1/1977 | Mandock | 307/117 X |
| 4,015,928 | 4/1977 | Carlson | 431/27 X |
| 4,080,512 | 3/1978 | Ramet et al. | 174/68.5 |
| 4,113,419 | 9/1978 | Cade | 307/141 X |
| 4,137,035 | 1/1979 | Cade | 431/29 X |
| 4,168,949 | 9/1979 | Hamelink et al. | 328/6 X |
| 4,269,589 | 5/1981 | Matthews | 431/24 X |
| 4,298,334 | 11/1981 | Clark et al. | 431/24 |
| 4,359,315 | 11/1982 | Matthews | 431/25 |
| 4,382,770 | 5/1983 | Pinckaers | 431/18 X |
| 4,384,845 | 5/1983 | Hinton et al. | 431/25 X |
| 4,405,299 | 9/1983 | Serber | 431/25 X |
| 4,456,800 | 6/1984 | Holland | 200/5 A |
| 4,516,930 | 5/1985 | Dietz | 431/26 |
| 4,554,614 | 11/1985 | Wijst | 361/404 X |

OTHER PUBLICATIONS

Honeywell Installation and Instruction Sheet, Form No. 68-0044-2, Revised, Sep. 1984, entitled Hot Surface Ignition Control-S89C.

Primary Examiner—William M. Shoop, Jr.
Assistant Examiner—Shik Luen Paul Ip
Attorney, Agent, or Firm—Alfred N. Feldman

[57] ABSTRACT

An ignition control device that utilizes a very sensitive flame rectification signal responsive circuit is disclosed. A printed wiring board arrangement is utilized with a careful arrangement of the conductive areas on the printed wiring board to substantially eliminate leakage paths that can provide a false indication of the presence of flame when none in fact is present.

10 Claims, 3 Drawing Figures

4,641,043

PRINTED WIRING BOARD MEANS WITH ISOLATED VOLTAGE SOURCE MEANS

BACKGROUND OF THE INVENTION

In the construction of electronic control devices it is common practice to use a printed wiring board which has an insulated surface that in turn supports a plurality of conductive surfaces as one element of the device's structure. The printed wiring board supports a number of electronic components that are interconnected by the printed wiring board's conductive areas. This type of structure, if exposed to a moist atmosphere, can fail due to condensation shorting out electrical paths between the conductive areas. This in turn causes paths to develop across the printed wiring board that allows the migration of potentials from one type of voltage source to another. In electronic control devices that have no safety function, this is an inconvenience, but not a safety problem. In devices that have safety functions, the shorting out of the conductive areas by moisture, and the subsequent migration of unwanted potentials, can create an unsafe mode of operation.

A typical type of control device that provides a safety function is a burner control apparatus in which the device is responsible for the safe ignition of the fuel, with subsequent monitoring of a flame. Typical of this type of device is an S89C Hot Surface Ignition Control as manufactured by Honeywell Inc. The S89C utilizes a hot surface ignitor which, when energized, ignites a gaseous fuel from a burner. The hot surface ignitor then acts as a flame rod to provide a flame rectification signal that monitors the presence of a flame at the burner. Typically, the flame rectification signal is a very small rectification signal, and is usually negative in potential with respect to a ground circuit or a positive potential used in the balance of the device. These types of units, if exposed to moisture, can have condensation of their printed wiring boards which causes migration of voltages that can cause the flame sensing circuit to believe a flame exists when no flame exists. This type of problem has been encountered in installations in food processing locations. It is quite common in these environments for the control device to be exposed to atmospheric moisture or to the spray of water from clean-up activities.

This type of problem can be readily solved by providing completely sealed electronic control devices, or by "potting" the device. Potting is a term used to generically refer to electronic equipment which has been filled with a plastic-like material that either becomes hard or semi-hard, but totally seals the device from moisture. The use of a totally water-tight enclosure or potting creates both a cost penalty, and a situation that makes repair of the device difficult or impossible.

SUMMARY OF THE INVENTION

The present invention is directed to an arrangement for providing an electronic control device with a printed wiring board means that has certain sections of the electronic circuitry segregated from other sections. Further, circuits are isolated by conductive areas on the printed wiring board which are either at a ground potential or are part of a power supply means with a potential that can cause only a safe form of failure, if a failure in fact occurs.

In the present invention, a flame sensing circuit that responds to a very small negative flame rectification signal is isolated on one part of the printed wiring board. The flame rectification sensing circuit indicates the presence of flame only when a negative potential is present at the gate of a field effect transistor that forms an input circuit to the flame sensing circuit. In order to avoid the possibility that a negative potential will inadvertently appear at the gate of the field effect transistor due to the migration of a negative potential from the balance of the circuitry, all negative voltage source means are isolated as a second area on the printed wiring board. The area containing the negative potential components is isolated from the flame rectification sensing circuit means by a combination of the ground conductors on the printed wiring board, and by interposing conductors that are normally associated with the positive voltage source means of the ignition control device. By properly isolating the flame rectification sensing circuit means, the negative voltage source means, and by the judicious placement of conductors normally associated with the circuitry that are powered from a positive voltage source means, the migration of a negative potential from the negative voltage source means to the flame rectification sensing circuit means due to the presence of moisture can be substantially eliminated.

In accordance with the present invention, there is provided an ignition control device that includes flame rectification sensing circuit means that responds to a very small flame rectification signal, including: printed wiring board means that has an insulated surface that in turn supports a plurality of conductive areas; electronic components mounted by said printed wiring board means, and electrically interconnected by said conductive areas to provide an electronic circuit for said control device; said electronic components in part providing said flame rectification sensing circuit means which is adapted to be connected to flame rod means to respond to the presence or absence of a flame; said ignition control device including power supply means having positive voltage source means and negative voltage source means; a first area on said printed wiring board means including said flame rectification sensing circuit means; a second area on said printed wiring board means including said negative voltage source means; and said positive voltage source means including a portion of said conductive areas with at least some of said positive voltage source means portion of said conductive areas being placed between said first and said second areas to prevent unwanted migration of negative potential from said negative voltage source means to said flame rectification sensing circuit means to thereby prevent false indication of the presence of a flame when none is in fact present.

DESCRIPTION OF THE PREFERRED EMBODIMENT

Figure 1:
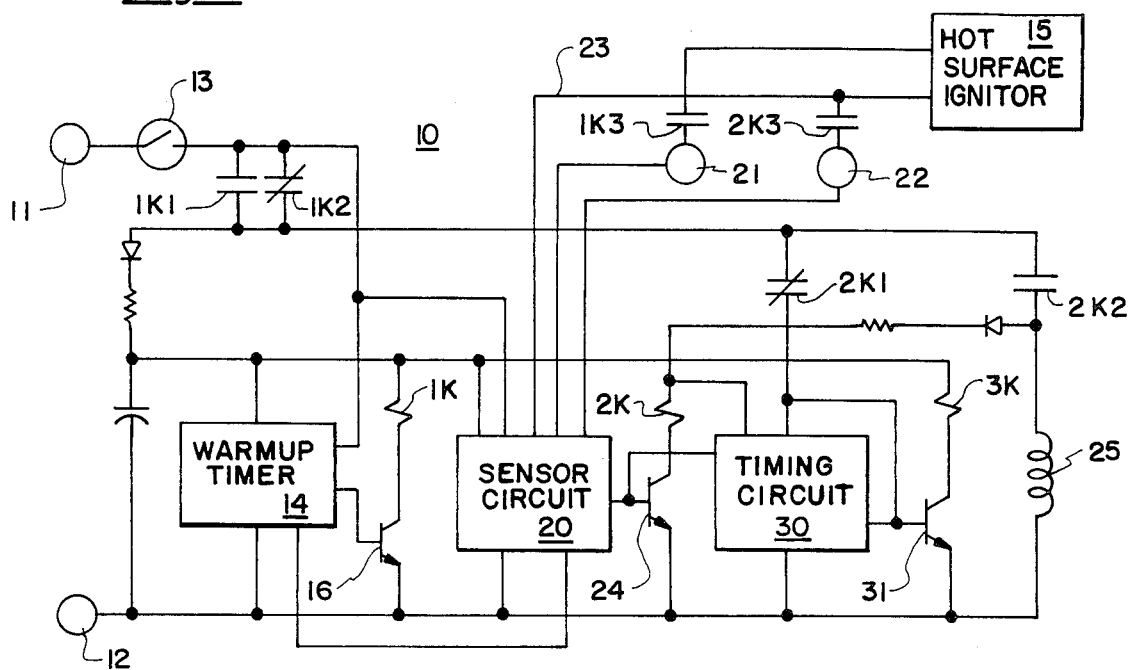
FIG. 1 is a block diagram of a typical hot surface ignition control.

In FIG. 1 there is disclosed at 10 an electronic control device that could be a form of the previously mentioned S89C Hot Surface Ignition Control as manufactured by Honeywell Inc. The control device 10 is connected by terminals 11 and 12 to an appropriate source of power and is operated in response to a thermostat 13. Normally the power supplied at terminals 11 and 12 would be an alternating current supply of 24 volts. Contained within the control device 10 is a warm-up timer 14 that allows for a sufficient period of warm-up of a hot surface ignitor element 15. The warm-up timer 14 controls a transistor 16 that in turn is connected in series with a relay 1K. The relay 1K has a pair of relay contacts 1K1 and 2K1 that function as part of a safe start check and warm-up function. Their detailed operation will not be explained as it is not directly pertinent to the invention, except to state that the state of the relay 1K determines in part whether the control device 10 can function safely.

The control device 10 further has a sensor circuit 20 that is connected to a pair of voltage terminals 21 and 22 which are in turn connected through relay contacts 1K3 and 2K3 to the hot surface ignitor 15. It is obvious that when the relay contacts 1K3 and 2K3 are closed, the hot surface ignitor 15 is connected to the voltage terminals 21 and 22 and can heat. If the contacts 1K3 and 2K3 are open circuited, as shown in the drawing, the hot surface ignitor 15 is connected by a conductor 23 to the sensor circuit 20, and acts as a flame rod. This function is a function contained in the S89C mentioned before. The sensor circuit 20 (along with a timing circuit 30) has an output transistor 24 that is connected in series with a relay 2K which has a pair of contacts 1K2 and 2K2. The 1K2 contact is a normally closed contact that acts as part of the safe start check circuit along with the relay contact 1K1. The contact 2K2 is used to energize a circuit to a gas valve or fuel valve disclosed at 25. Since the relay 2K controls the contact 2K2 that in turn connects the fuel valve 25 to a source of power, it is quite apparent that the operation of the transistor 24 in energizing or deenergizing the relay 2K effectively controls the fuel valve 25.

The control device 10 is generally completed by the timing circuit 30 in turn having an output transistor 31 and an associated relay 3K. The relay 3K controls the two contacts 1K3 and 2K3 that energize and deenergize the hot surface ignitor 15.

In normal operation of the S89C type device, the closing of the thermostat 13 causes the warm-up timer 14 to allow the hot surface ignitor 15 to become energized for a set period of time. A safe start check is run which includes the relay contacts 1K1 and 1K2. After a sufficient warm-up period of time has occurred, the timing circuit 30 operates the relay 2K to close the contact 2K2 and open the gas valve or fuel valve 25. The hot surface ignitor 15 ignites the fuel and is ready to act as a flame rectification sensor. The timing circuit 30 then causes the relay contacts 1K3 and 2K3 to open circuit which deenergizes the hot surface ignitor 15 as an ignition element, and leaves it solely as a flame rectification device. The circuit operation just described basically is the type of a circuit operation of the S89C of the Honeywell Hot Surface Ignition Control Device. This type of a device relies on a very small flame rectification signal on the conductor 23, and the device is being improved to avoid any problem with moisture. The device has been disclosed as a prior art device. The present invention is incorporated in this type of a prior art device, and will now be described in connection with a complete circuit diagram of FIG. 2.

Figure 2:
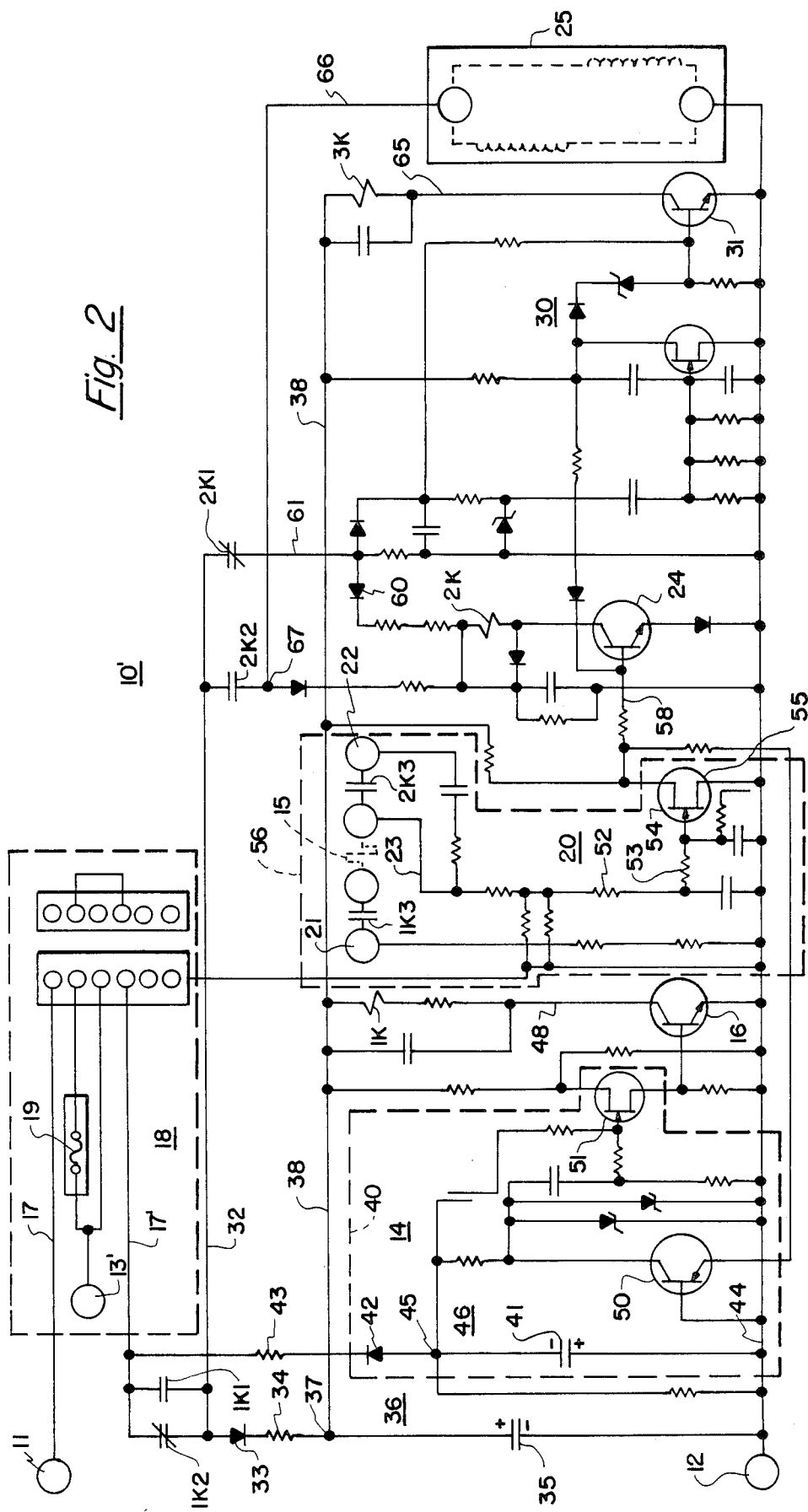
FIG. 2 is a detailed circuit diagram of the novel device.

In FIG. 2 an electronic control device in the form of an ignition control device 10' is disclosed. The ignition control device 10' incorporates the present novel arrangement wherein the flame rectification sensing circuit means is prevented from receiving unwanted migration of negative potentials that can inadvertently cause a false indication of the presence of flame when none in fact is present. Only small portions of the total circuit diagram will be specifically identified and will correspond generally with parts of the circuit diagram of FIG. 1. The identified areas also will be correlated with a disclosure of a complete printed wiring board means disclosed in FIG. 3.

In FIG. 2 the ignition control device 10' is generally disclosed and includes a pair of terminals 11 and 12 that typically would be energized from a source of potential such as a 24 volt alternating voltage source. The terminal 11 is connected by a conductor 17 to a damper plug adapter generally disclosed at 18. The adapter 18 is utilized in the device, but its function is not particularly important to the present invention. It has been disclosed as a means of fully disclosing a best mode of utilizing the present invention. The damper plug adapter 18 includes a fuse 19 and a terminal 13' for connection to a thermostat. The conductor 17 is continued at 17' through the damper plug adapter 18 and supplies a potential from the terminal 11 whenever it is appropriate to energize and operate the ignition control device 10'.

The conductor 17' is connected to a pair of relay contacts 1K2 and 1K1 which in turn supply power to a conductor 32 that distributes an alternating current potential to the relay contacts 2K2 and 2K1. The potential on the conductor 32 is also connected through a diode 33, a resistor 34, and a capacitor 35 to the terminal 12 to supply a potential that will be referred to as a positive voltage source means 36. At a junction 37 between the resistor 34 and the capacitor 35 there is connected a conductor 38 that forms the main distribution conductor of a positive potential for the present device. The conductor 38 forms an important part of the present invention as will be brought out in connection with FIG. 3.

A warm-up timer 14 is disclosed as partially being enclosed in a dash box 40 which further includes a negative voltage source means 46. The negative voltage source means 46 is made up of a capacitor 41, a diode 42, and a resistor 43 which are connected between the terminal 12 and the conductor 17'. It will be noted that the capacitor 41 will take on a charge that is reversed to the charge on the capacitor 35, and has a positive end connected to a conductor 44 that is connected in turn to the terminal 12. The conductor 44 forms the ground for the overall circuitry. A junction 45 between the capacitor 41 and the diode 42 has a negative potential that is used as the negative voltage source means 46 that is used to operate a transistor 50 and a field effect transistor 51 that forms part of the warm-up timer 14. The transistor 50 and the field effect transistor 51 (along with their operating electronic components) make up the negative voltage source means 46 and a portion of the warm-up timer 14. The negative voltage source means 46 and the components in box 40 must be kept isolated from other portions of the present circuitry in order to provide safe operation.

The field effect transistor 51 is used to control the transistor 16 which in turn controls the relay 1K. The transistor 16 and the relay 1K are functionally operated by the positive voltage source means 36 from the conductor 38.

The sensor circuit 20 includes the hot surface ignitor 15, the normally open contacts 1K3 and 2K3, along with the voltage terminals 21 and 22. Their function is the same in the present FIG. 2 as in the prior art circuit of FIG. 1. When the relay contacts 1K3 and 2K3 are open circuited (as shown), the hot surface ignitor 15 is used as a flame rod. The hot surface ignitor 15 when operating as a flame rod is connected by conductor 23 to a resistor 52, a further resistor 53, and a gate 54 of a field effect transistor 55. The field effect transistor 55 has an output circuit 58 to control the transistor 24 which in turn controls the relay 2K. The energizing potential for the relay 2K and the transistor 24 is provided through the diode 60 and the conductor 61 from the normally closed relay contact 2K1 to the conductor 32. It is thus apparent that the voltage driving the transistor 24 is a positive voltage as is the voltage which was disclosed as driving the transistor 16.

The flame rectification sensing circuit means 20 has been disclosed as enclosed at 56. This particular circuit is very sensitive to unwanted negative voltage at the gate 54 of the field effect transistor 55. Since the flame rectification signal from the hot surface ignitor 15 is a very small negative signal, any migration of a negative potential into the area defined at 56 can inadvertently cause the field effect transistor 55 to respond in a manner indicating that flame is present when in fact it may not be present. As such, it is essential that the area defined by the dash box 56 be protected to prevent any migration of voltage from the negative potential generated across the capacitor 41 from reaching the gate 54 of the field effect transistor 55. This is typically due to moisture creating leakage paths on the printed wiring board of the device.

The balance of the ignition control device 10' is disclosed as being a timing circuit 30 which has an output transistor 31 that controls the relay 3K through a conductor 65. The conductor 65 becomes an important element of the present invention and will be discussed in connection with FIG. 3. The operation of the device is completed by providing the fuel valve or gas valve 25 with the conductor 66 to a junction 67 with the relay contact 2K2. The relay 2K operates in response to the timing circuit 30 at start up, or under the control of the sensor circuit 20 in response to flame at the hot surface ignitor 15 to supply energy on the conductor 66 to the fuel valve 25 to admit fuel to a burner. It is thus apparent that any false signal indicating that the hot surface ignitor 15 perceives a flame can be caused by a negative potential at the gate 54, and can inadvertently cause the valve 25 to open.

Figure 3:
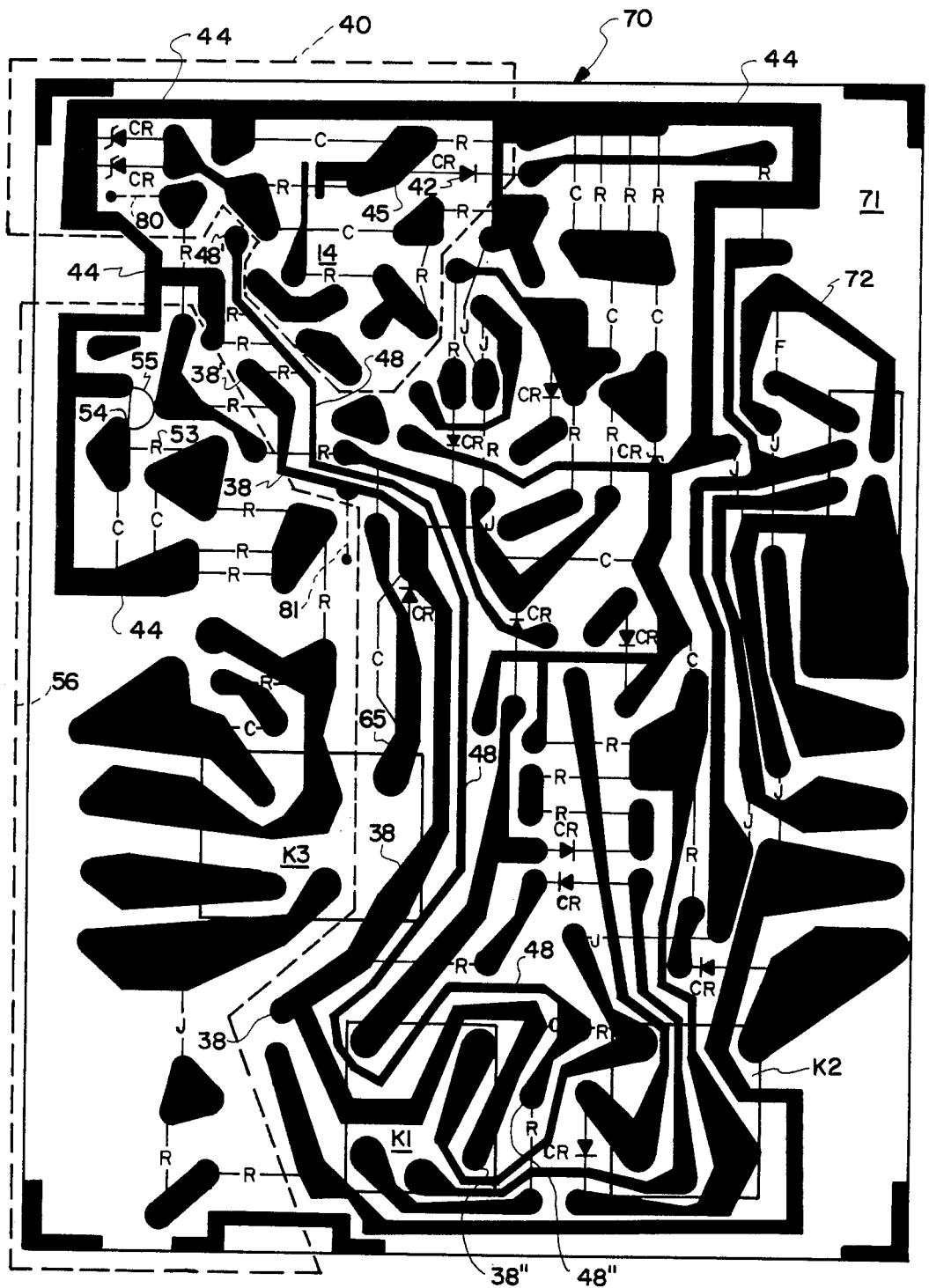
FIG. 3 is a disclosure of a printed wiring board for the circuitry disclosed in FIG. 2.

In FIG. 3 a printed wiring board means is generally disclosed at 70. The printed wiring board means 70 is made up of an insulating material having an insulating surface 71 that in turn supports a plurality of conductive areas, such as 72. The conductive areas 72 have been shown as dark areas in a conventional manner for a printed wiring board. Electronic components are mounted by the printed wiring board means 70 and have been generally indicated only by a reference such as "C" for a capacitor, "R" for resistor, "CR" for rectifier, etc. No effort is going to be made to identify the circuitry of FIG. 2 on the printed wiring board means of FIG. 3, except in general terms to explain the present invention.

The negative voltage source means 46 exemplified by the potential at point 45 as shown in FIG. 2 falls in the warm-up timer portion 14 of the circuitry. The area of the printed wiring board which includes the negative voltage source means 45 is disclosed by a dash box 40 (referred to as the second area) which encircles a ground conductor 44 and a number of the components and conductive areas which are included in the negative voltage source means 46. The junction 45 has been identified on the printed wiring board for reference. It should be understood that all of the voltages that occur within the second area on the printed wiring board means 70 form a portion of the negative potential that must be isolated from the sensor circuit 20 in order to provide safe operation.

The area 56 (referred to as the first area) of the printed wiring board that contains the flame rectification sensing circuit 20 is disclosed at 56 as a dash box and encompasses many of the components including the ground 44. The gate 54 of the field effect transistor 55 has been located as a matter of reference within the first area of the printed wiring board as enclosed by the dash box 56.

In addition to the components previously mentioned the three relays 1K, 2K and 3K have been located on the printed wiring board as a matter of reference. These are standard relays that are mounted on a printed wiring board with projecting leads so that they can be soldered into the board as part of the electronic components that are mounted on the printed wiring board.

In addition to the elements previously identified in FIG. 3 on the printed wiring board 70, three specific conductive areas will now be identified to highlight the present invention. The conductor 38 disclosed in FIG. 2 as a positive voltage source is disclosed as running from an upper location 38' to a lower location 38''. It will be noted that the conductor 38 extends from near the bottom of the printed wiring board, as disclosed in FIG. 3, to a point near the upper end of the first area 56 which includes the flame rectification sensing circuit means 20.

Laying adjacent to the conductive area 38 is the conductive area 65 which forms the connection between the relay 3K and the transistor 31. The conductor 65 reinforces the positive potential isolation of the area 56 which includes the flame rectification sensing circuit means 20 from the balance of the conductors on the printed wiring board 70.

The invention is completed by the addition of the conductor 48 that lies generally parallel to the conductor 38 on the printed wiring board means 70 and begins at 48' and extends to the lower end of 48''. Laying adjacent to the upper end 48' of the conductor 48 is part of the conductor 44 that forms the ground of the circuit, and this ground helps to isolate the area 40 that encloses the negative power supply or voltage at point 45.

In considering the printed wiring board means 70 of FIG. 3, it is apparent that the area 40 which encloses the negative voltage source means 46 is substantially isolated from the area 56 which includes the flame rectification sensing circuit means 20. The isolation is created by the conductors on the printed wiring board 70 such as the conductive areas 65, 38, and 48, along with the ground conductor 44.

With this arrangement it is difficult, if not impossible, for a moisture related leakage path to develop from the negative area 40 to the gate 54 of the field effect transistor 55 to thereby falsely indicate the presence of flame caused by the presence of moisture. With the present printed wiring board means arrangement it is possible to create a safe operating ignition control device wherein the flame rectification sensing circuit means is isolated in such a manner as to make the device safe from false indication of the presence of flame when none is present due to a high moisture or condensation environment.

The control of the migration of voltages on the printed wiring board 70 can be further enhanced by adding jumper-like conductors 80 and 81 on the component side of the printed wiring board 70 as shown in FIG. 3. Jumpers 80 and 81 are nothing more than bare wires which are attached, at least at one end, to the printed wiring board pattern so that a voltage appears on the components side of the printed wiring board 70. The component side supports the components such as the capacitors "C", the resistors "R" and the rectifiers "CR". It will be noted that the jumper 80 is adjacent to a pair of rectifiers CR in the upper lefthand corner of the printed wiring board 70. The jumper 80 is along side the diodes CR and isolates any voltage migration from the rectifiers in the negative power supply 40 from reaching the area defined by the box 56. The jumper 81 is connected from the positive conductor 38 and acts to isolate components elsewhere in the circuit. By adding jumpers on the component side of the printed wiring board additional patterns can be developed to inhibit migration of voltages that might possibly be caused by vapor, such as water vapor, or by the condensed form of the vapor as dew.

The present invention utilizes a unique arrangement of printed wiring board patterns of conductive areas to isolate voltage sources so that inadvertent leakage paths are substantially eliminated as a failure mode that can cause the ignition control device to indicate the presence of flame when none in fact is present. The arrangement of components can be altered extensively and the applicants wish to be limited in the scope of their invention solely by the scope of the appended claims.

The embodiments of an invention in which an exclusive property or right is claimed are defined as follows:

1. An ignition control device that includes flame rectification sensing circuit means that responds to a very small flame rectification signal, including: printed wiring board means that has an insulated surface that in turn supports a plurality of conductive areas; electronic components mounted upon said printing wiring board means, and electrically interconnected by said conductive areas to provide an electronic circuit for said control device; said electronic components in part providing said flame rectification sensing circuit means which is connected to flame rod means to respond to the presence or absence of a flame; said ignition control device including power supply means having positive voltage source means and negative voltage source means; a first area on said printed wiring board means including said flame rectification sensing circuit means; a second area on said printed wiring board means including said negative voltage source means; and said positive voltage source means being connected to and including a portion of said conductive areas with at least some said conductive areas of said positive voltage source means portion being placed between said first and said second areas to prevent unwanted migration of negative potential from said negative voltage source means to said flame rectification sensing circuit means to prevent said negative potential from falsely causing an indication of the presence of a flame when none is in fact present.

2. An ignition control device as claimed in claim 1 wherein said flame rectification sensing circuit means has input circuit means that responds to a negative flame rectification signal voltage as an indication that a flame is present at said flame rod means.

3. An ignition control device as claimed in claim 2 wherein said flame rectification sensing circuit means includes a field effect transistor having a gate as part of said input circuit means.

4. An ignition control device as claimed in claim 3 wherein said unwanted migration of said negative potential is caused by moisture condensation on said printed wiring board means.

5. An ignition control device as claimed in claim 1 wherein said conductive area portion of said positive voltage source means which is placed between said first and said second areas to prevent unwanted migration of negative potential is part of an existing circuit of said ignition control device.

6. An ignition control device as claimed in claim 5 wherein said unwanted migration of said negative potential is caused by moisture condensation on said printed wiring board means.

7. An ignition control device as claimed in claim 6 wherein said flame rectification sensing circuit means has input circuit means that responds to a negative flame rectification signal voltage as an indication that a flame is present at said flame rod means.

8. An ignition control device as claimed in claim 7 wherein said flame rectification sensing circuit means includes a field effect transistor having a gate as part of said input circuit means.

9. An ignition control device as claimed in claim 1 wherein said printed wiring board means has a second insulated surface on a side opposite said printed wiring board from said insulated surface that supports a plurality of conductive areas; and said second insulated surface supporting jumper means connected through said printed wiring board and in contact with at least one of said plurality of conductive areas; said jumper means isolating a portion of said second insulated surface to prevent migration of voltage on said second surface.

10. An ignition control device as claimed in claim 9 wherein said unwanted migration of voltage is caused by moisture condensation on said printed wiring board means.

* * * * *